(12) United States Patent  
Sakurai et al.

(10) Patent No.: US 7,084,008 B2  
(45) Date of Patent: Aug. 1, 2006

(54) MANUFACTURING METHOD FOR ELECTRONIC COMPONENT-MOUNTED COMPONENT, MANUFACTURING METHOD FOR ELECTRONIC COMPONENT-MOUNTED COMPLETED PRODUCT WITH THE ELECTRONIC COMPONENT-MOUNTED COMPONENT, AND ELECTRONIC COMPONENT-MOUNTED COMPLETED PRODUCT

(75) Inventors: Daisuke Sakurai, Toyonaka (JP); Norihito Tsukahara, Kyoto-fu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 101 days.

(21) Appl. No.: 10/694,347

(22) Filed: Oct. 28, 2003

(65) Prior Publication Data

US 2004/0115864 A1    Jun. 17, 2004

(30) Foreign Application Priority Data

Oct. 30, 2002    (JP) ............................. 2002-316022

(51) Int. Cl.  
*H01L 21/44* (2006.01)

(52) U.S. Cl. ..................... 438/112; 438/107; 438/124; 438/459

(58) Field of Classification Search ............... 438/109, 438/112, 113, 114, 124, 125, 126, 127, 458, 438/459, 455, 464, 107  
See application file for complete search history.

(56) References Cited

U.S. PATENT DOCUMENTS

| 6,350,664 B1 * | 2/2002 | Haji et al. .................. 438/459 |
| 6,486,006 B1 * | 11/2002 | Hirano et al. ............... 438/125 |
| 6,780,668 B1 | 8/2004 | Tsukahara et al. |
| 6,798,121 B1 * | 9/2004 | Nakatani et al. ............ 310/340 |
| 6,828,175 B1 * | 12/2004 | Wood et al. ................. 438/113 |

FOREIGN PATENT DOCUMENTS

| JP | 62-230027 | 10/1987 |
| JP | 2001-93926 | 4/2001 |
| JP | 2001-250839 | 9/2001 |

OTHER PUBLICATIONS

Shingo Sato et al., entitled "*Board Reliability of Ceramic CSP by Various Kinds of Solder Material*", at a symposium on "Microjoints and Assembly Technology in Electronics" on Feb. 4-5, 1999, p. 133.

* cited by examiner

*Primary Examiner*—Kevin M. Picardat  
(74) *Attorney, Agent, or Firm*—Wenderoth, Lind & Ponack, L.L.P.

(57) ABSTRACT

A semiconductor element (111) with electrodes (112), and a passive element (113) with electrodes (113a) are embedded in a thermoplastic sheet base (115), which is then subjected to laser beam machining, electron beam machining or ion beam machining to expose electrodes (112 and 113a). Thereafter, a circuit pattern (119) is formed by formation of a thin film or printing of a conductive adhesive. Exposing the electrodes by laser beam machining or the like can be carried out in a short period of time and also by local treatment, thereby reducing damage to the base.

12 Claims, 8 Drawing Sheets

MANUFACTURING METHOD FOR ELECTRONIC COMPONENT-MOUNTED COMPONENT, MANUFACTURING METHOD FOR ELECTRONIC COMPONENT-MOUNTED COMPLETED PRODUCT WITH THE ELECTRONIC COMPONENT-MOUNTED COMPONENT, AND ELECTRONIC COMPONENT-MOUNTED COMPLETED PRODUCT

BACKGROUND OF THE INVENTION

The present invention relates to a manufacturing method for electronic component-mounted components to manufacture electronic component-mounted components by mounting electronic components such as semiconductor elements to a base, a manufacturing method for electronic component-mounted completed products with the electronic component-mounted components, and electronic component-mounted completed products with the electronic component-mounted components. The electronic component-mounted completed product with the electronic component-mounted components corresponds to stack modules, memory cards, non-contact IC cards and the like.

A conventional manufacturing method for an electronic component-mounted completed product which has, for example, a plurality of semiconductor elements, capacitors, resistors and the like passive components mounted on one carrier substrate will be described below with reference to FIGS. 11 and 12.

Conventionally, in a CSP (chip size package), an MCM (multi chip module) or a memory module having semiconductor elements, electronic components and the like passive components mounted thereon, a mounting method has been employed for the semiconductor elements, by which the semiconductor elements are pressed with heat in contact onto the carrier substrate via a conductive adhesive or a conductive sheet. For the electronic components, a method has been employed by which the electronic components are mounted in a predetermined circuit pattern by reflowing a solder paste printed in the predetermined circuit pattern on the carrier substrate.

More specifically, as shown in FIG. 11, projection-shaped electrodes 2 formed at electrode pads 1a of a semiconductor element 1 are electrically connected via an anisotropic conductive adhesive 15 to electrodes 3 on a carrier substrate 6. A sealing material 5 is injected and hardened between the semiconductor element 1 and the carrier substrate 6 so as to improve the jointing strength therebetween. At the opposite side of a mounting face of the semiconductor element 1, electrodes 4 of the carrier substrate 6 and predetermined electrodes 8 of a motherboard 11 are connected with each other via a solder paste 7, whereby the carrier substrate 6 is connected to the motherboard 11. To the electrodes 8 of the motherboard 11 are connected electrodes 10 of an electronic component 9 via the solder paste 7.

Reference numeral 13 denotes a through hole for electrically connecting the electrode 8 on a front face of the motherboard 11 to a circuit pattern 12 at a rear face of the motherboard 11. The through hole 13 is unnecessary in the case of a product without the circuit pattern 12.

A memory module 14 as an example of the electronic component-mounted completed product with the electronic component-mounted components formed in the above configuration.

As shown in FIG. 12, in a manufacturing process for the memory module 14, the solder paste 7 is applied by printing onto predetermined electrodes 8 on the motherboard 11 in a first step (denoted by "S" in the drawing) 1. Printing the solder paste 7 is normally carried out by screen printing. In a next step 2, the carrier substrate 6 with the semiconductor element 1 loaded and the electronic component 9 are registered onto the solder paste 7 formed by the printing respectively. In a succeeding step 3, the carrier substrate 6 with the semiconductor element 1, and the motherboard 11 with the electronic component 9 are passed through a reflow furnace to melt the solder paste 7. The solder paste is then hardened.

The memory module 14 as the electronic component-mounted completed product is manufactured in the manner as above (for instance, with reference to a non-patent document 1: "Board Reliability of Ceramic CSP by Various Kinds of Solder Material" by Satoh, et al. at a symposium on "Microjoints and Assembly Technology in Electronics" on Feb. 4–5, 2002, on page 133.)

The above-described conventional manufacturing method for the electronic component-mounted completed product with the electronic component-mounted components, and the configuration of the MCM or memory module as the electronic component-mounted completed product manufactured by the manufacturing method have the following problems that have yet to be solved.

Since electronic components such as the CSP are loaded on the motherboard 11, the module is increased in size in a thickness direction and thus cannot respond to the latest need for products to be thinned. The module is prone to be subject to effects of bending because of the increased thickness and is difficult to be made flexible and applicable to a surface or the like shape. In addition, the motherboard 11 necessitates a region for loading the electronic component 9 and the carrier substrate 6. Consequently, the number of electronic components loadable on one motherboard 11 and a region for forming the circuit pattern are determined by the size of the motherboard 11, which hinders efforts to meet the recent need of miniaturization of the motherboard 11.

Furthermore, since the semiconductor element 1 and the solder paste 7 are directly exposed to the atmosphere, oxidation takes place when the element and the solder paste are used under a high-temperature and high-humidity environment, often resulting in an electric short circuit, imperfect contact, a decrease in jointing strength and the like. Also because of the uneven temperature in the reflow furnace, the motherboard 11 cannot be made large-size. The productivity is poor although a batch process is a mainstream.

SUMMARY OF THE INVENTION

The present invention has been devised to solve the above problems, and an object of the present invention is to provide a high-quality, high-productivity and inexpensive manufacturing method for electronic component-mounted components, a manufacturing method for electronic component-mounted completed products with the electronic component-mounted components, and electronic component-mounted completed products.

In accomplishing the object, according to a first aspect of the present invention, there is provided a manufacturing method for electronic component-mounted components, which comprises:

embedding an electronic component into a base;

removing the base by carrying out at least one treatment of electrical discharge machining, laser beam machining, ion beam machining and electron beam machining to a machining face of the base, and thereby exposing electrodes of the embedded electronic component; and forming a circuit pattern in contact with the exposed electrodes.

The method of the first aspect may be designed so that the method further comprises:

forming a through hole to penetrate the machining face and a rear face opposite to the machining face while carrying out the treatment to the base, and while forming the circuit pattern, forming an electric connection between the machining face and the rear face via the through hole by at least one of conductive sputtering, vapor deposition and filling with a conductive material.

The method of the first aspect may be designed so that the electrodes of the electronic component have projecting electrodes, and the exposing operation after the embedding into the base is to expose the projecting electrodes.

The method of the first aspect may be designed so that the circuit pattern forming operation forms at least one of a conductor routing, a metal thin film capacitor, a coil and a resistance in contact with the exposed electrodes by any one of plating, ion plating, sputtering and vapor deposition.

The method of the first aspect may be designed so that the circuit pattern forming operation forms the circuit pattern by printing a solder paste or conductive adhesive on the exposed electrodes, then heating and hardening the solder paste or conductive adhesive.

The method of the first aspect may be designed so that embedding the electronic component into the base is carried out with a plurality of electronic components in the same process, and after the circuit pattern is formed, the base is cut so as to correspond to the respective electronic component-mounted components.

The method of the first aspect may be designed so that embedding the electronic components into the base is carried out by heat press, the base is a thermoplastic sheet formed of any one of polyvinyl chloride, polycarbonate, acrylonitrile butadiene styrene, thermoplastic polyimide and polyethylene terephthalate and has a thickness of 0.010–2.000 mm. A glass transition point of the base is not lower than 333K and not higher than 423K. The electronic component has a thickness that is smaller than that of the base, electrodes of the electronic component have a height of 0.0005–0.1 mm, and the base at the heat press time is set to be at a temperature higher by 50K or more than the glass transition point and not higher than 473K.

According to a second aspect of the present invention, there is provided a manufacturing method for electronic component-mounted completed products, which comprises:

manufacturing electronic component-mounted components by a manufacturing method for electronic component-mounted components;

stacking the electronic component-mounted components or a base of the electronic component-mounted components in a thickness direction of the base after the manufacturing operation; and executing a laminating process after the stacking, the manufacturing method for electronic component-mounted components including:

embedding an electronic component into the base, removing the base by carrying out at least one treatment of electrical discharge machining, laser beam machining, ion beam machining and electron beam machining to a machining face of the base, and thereby exposing electrodes of the embedded electronic component, and forming a circuit pattern in contact with the exposed electrodes.

According to a third aspect of the present invention, there is provided an electronic component-mounted completed product manufactured by a manufacturing method for electronic component-mounted completed products, the manufacturing method comprising:

manufacturing electronic component-mounted components by a manufacturing method for electronic component-mounted components;

stacking the electronic component-mounted components or a base of the electronic component-mounted components in a thickness direction of the base after the manufacturing operation; and executing a laminating process after the stacking, the manufacturing method for electronic component-mounted components including:

embedding an electronic component into the base, removing the base by carrying out at least one treatment of electrical discharge machining, laser beam machining, ion beam machining and electron beam machining to a machining face of the base, and thereby exposing electrodes of the embedded electronic component, and forming a circuit pattern in contact with the exposed electrodes.

According to the manufacturing method for electronic component-mounted components of the first aspect, the manufacturing method for electronic component-mounted completed products of the second aspect, and the electronic component-mounted completed products of the third aspect of the present invention, the electronic component is embedded in the base, and therefore the thickness of the electronic component-mounted component can be reduced. The electronic component-mounted component is rendered more flexible than in the conventional art because of the thinning and can hence be used at a curved surface or at a place where a bending operation is executed. Moreover, since the electronic component is embedded, a region for forming a film at the base surface and for forming the circuit pattern is increased as compared with the conventional art, enabling the electronic component-mounted component to be highly functional and small in size. Additionally, since the electrical discharge machining, laser beam machining or the like is carried out so as to correspond to the electrodes of the embedded electronic component to expose the electrodes, the electrodes can be exposed in a shorter period of time than in the conventional art and through a local treatment, and thereby damage to the base is reduced. Hence the present invention can provide a high-quality, high-productivity and inexpensive manufacturing method for electronic component-mounted components, a manufacturing method for electronic component-mounted completed products, and electronic component-mounted completed products as described above.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
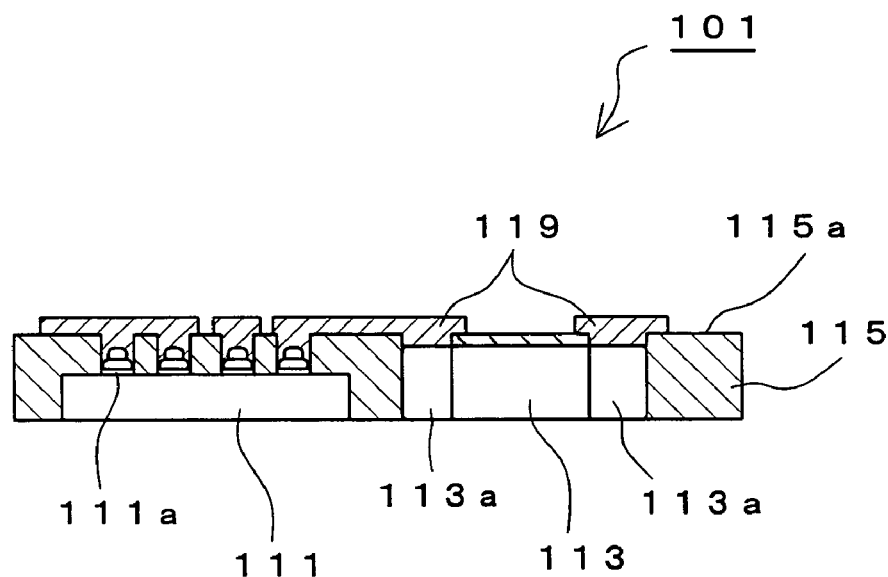
FIG. 1 is a sectional view of an electronic component-mounted component constructed in accordance with an embodiment of the present invention.

Before the description of the present invention proceeds, it is to be noted that like parts are designated by like reference numerals throughout the accompanying drawings.

A manufacturing method for electronic component-mounted components, a manufacturing method for electronic component-mounted completed products with the electronic component-mounted components, and electronic component-mounted completed products manufactured by the manufacturing method for electronic component-mounted completed products as embodiments of the present invention will be described below with reference to the drawings. Like parts are designated by like reference numerals throughout the drawings. Semiconductor elements, chip components as rectangular passive elements, cylindrical elements or the like, etc. correspond to one example of the electronic components included in the electronic component-mounted components.

An electronic component-mounted component 101 shown in FIG. 1 has a semiconductor element 111 and a passive element 113 embedded in a base 115. A circuit pattern 119 of the electronic component-mounted component 101 is formed on a machining face 115a of the base 115 after the base 115 is removed to expose respective electrodes 112 and 113a of the semiconductor element 111 and the passive element 113.

Figure 2:
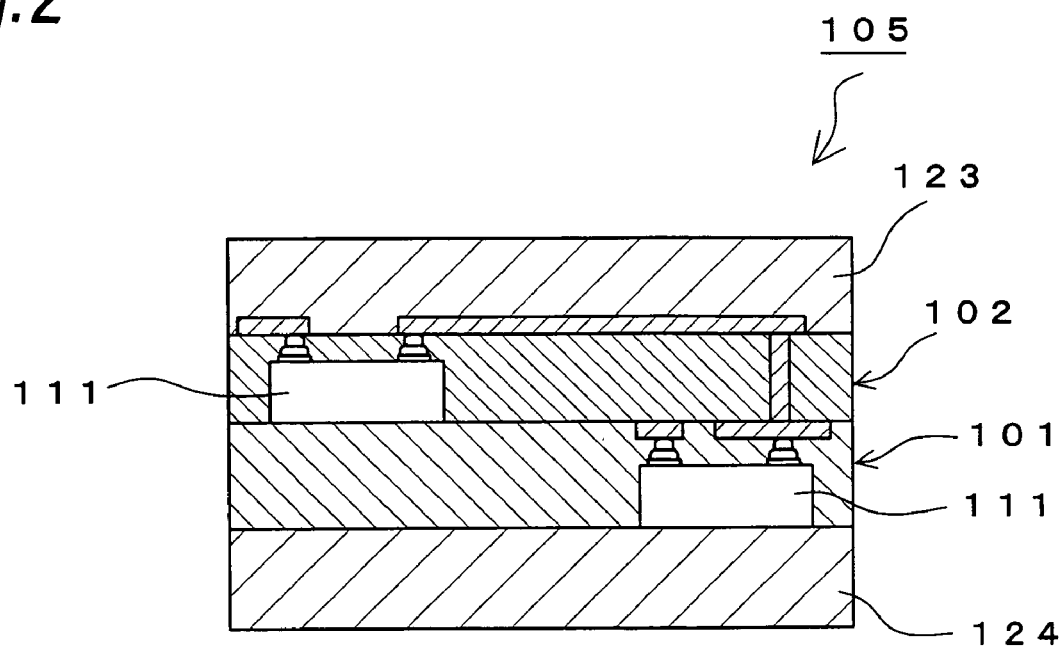
FIG. 2 is a sectional view of an electronic component-mounted completed product constructed in accordance with another embodiment of the present invention.

An electronic component-mounted completed product 105 shown in FIG. 2 has a structure in which the electronic component-mounted component 101 and an electronic component-mounted component 102 similar to the electronic component-mounted component 101 are stacked in two stages along a thickness direction of these electronic component-mounted components 101 and 102, and then laminated by sheet-shaped protecting materials 123 and 124.

A manufacturing method for the electronic component-mounted components 101 and 102, and the electronic component-mounted completed product 105 constructed as above will be described below.

First Embodiment

A manufacturing method for the electronic component-mounted component 101 will be described in the first place.

A process of mounting the semiconductor element 111 and the passive element 113 as electronic components into the base 115 includes a process of embedding the electronic components in the sheet-shaped base 115, a process of exposing electrodes 112 and 113a of the electronic components from the base 115, and a process of forming the circuit pattern 119 electrically connectible to the exposed electrodes 112 and 113a. The description here exemplifies the case of forming a sheet module having the semiconductor element 111 and the passive element 113 embedded in a thermoplastic sheet base as an example of the base 115.

The thermoplastic sheet base 115 is preferably, for example, polyethylene terephthalate, polyvinyl chloride, polycarbonate, acrylonitrile butadiene styrene, thermoplastic polyimide or the like having electrical insulating properties with a thickness of 10 µm–2.000 mm. The thickness of the thermoplastic sheet base 115 is preferably larger than that of the semiconductor element 111 and the passive element 113 to be embedded, and a height of the electrode 112 of the semiconductor element 111 is preferably 0.0005–0.1 mm. Moreover, a glass transition point of the thermoplastic sheet base 115 is preferably not lower than 333K and not higher than 423K. A temperature of the thermoplastic sheet base 115 at a heat press operation to be described later is preferably higher than the glass transition point by 50K or more and not higher than 473K.

Figure 3:
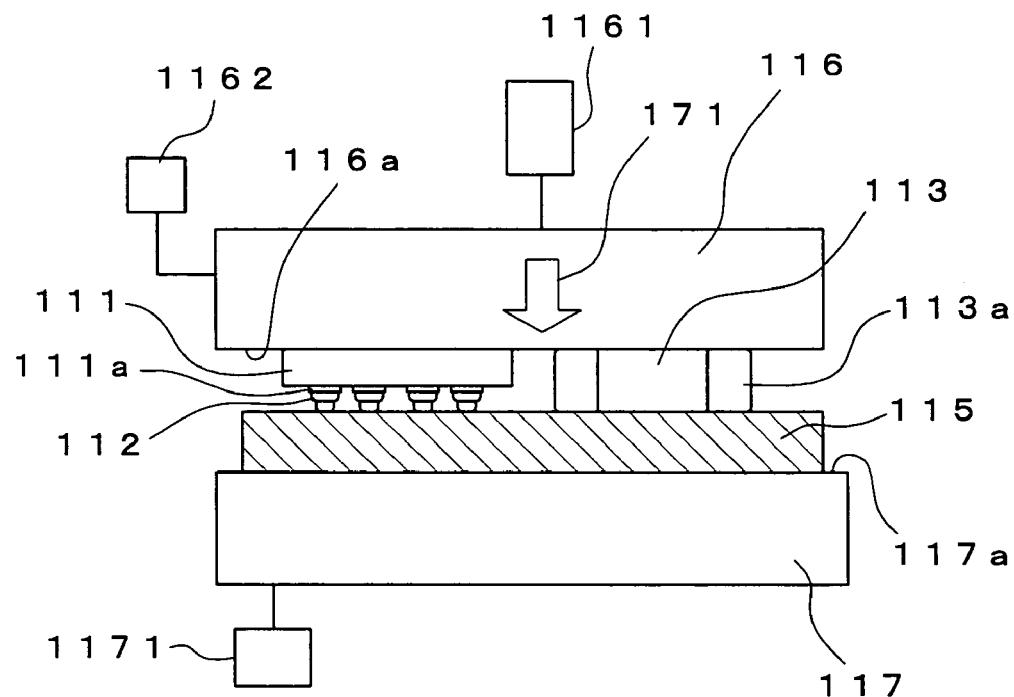
FIG. 3 is a diagram explanatory of a manufacturing process for the electronic component-mounted component shown in FIG. 1.
Figure 4:
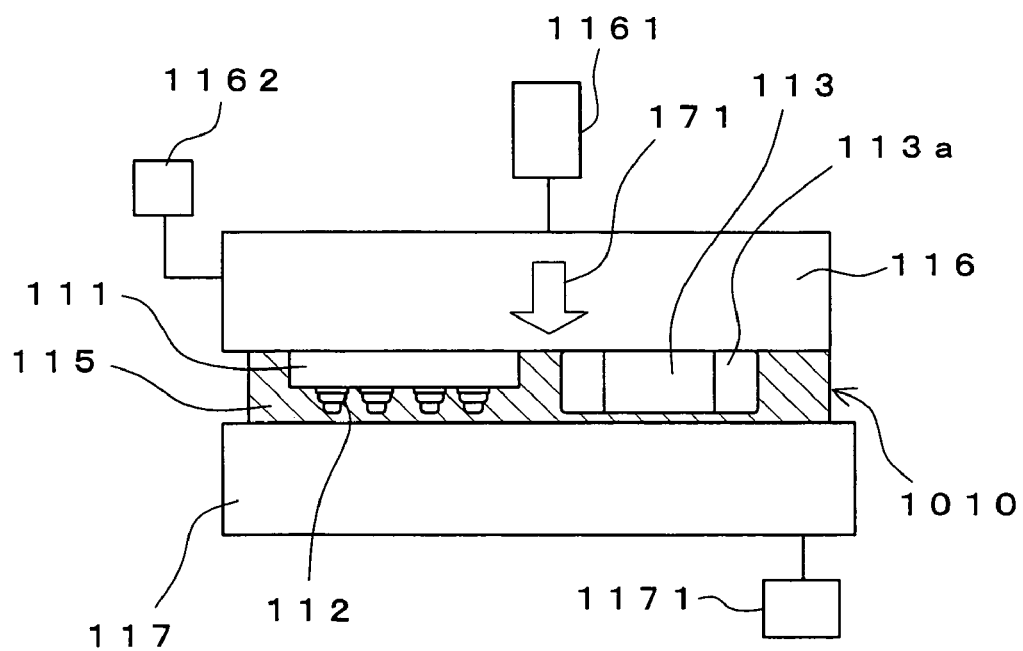
FIG. 4 is a diagram explanatory of the manufacturing process for the electronic component-mounted component of FIG. 1 and showing a state in which an electronic component is embedded in a base.

FIGS. 3 and 4 show sectional views of an example of the process of embedding the semiconductor element 111 and the rectangular passive element 113 into the thermoplastic sheet base 115. A method for embedding electronic components into the sheet base 115 is not limited to the illustrated one.

Projecting electrodes 112 are formed by known plating, stud bump bonding or the like manner to pads 111a of the semiconductor element 111. Moreover, a leveling process is carried out to the formed projecting electrodes 112, so that the projecting electrodes 112 are uniform in height. The leveling process may be omitted.

FIG. 3 is a diagram showing a state before the electronic components 111 and 113 are embedded in the thermoplastic sheet base 115. The thermoplastic sheet base 115 is laid on a heating stage 117 heatable by a heater 1171. The semiconductor element 111 and the rectangular passive element 113 with electrodes 113a are placed on the thermoplastic sheet base 115. Further, a press tool 116 which can be moved in a thickness direction 171 of the thermoplastic sheet base 115 by a drive unit 1161 and is heated by a heater 1162 is arranged in contact with the semiconductor element 111 and the rectangular passive element 113. A loading face 117a for the thermoplastic sheet base 115 on the heating stage 117, and a contact face 116a of the press tool 116 to the electronic components are formed of glass, stainless, a ceramic, Teflon (registered trademark) or the like to enhance a fluid velocity of the thermoplastic sheet base 115 in the vicinity of the electrodes 112 and 113a and are preferably flat and rigid.

Although not shown in the drawings, a releasing material is preferably used to prevent the thermoplastic sheet base 115 from melting and adhering to the press tool 116 when the press tool 116 heats and presses the semiconductor element 111 and the passive element 113. The releasing material is preferably, e.g., glass, a ceramic, paper, Teflon (registered trademark) or the like. For example, a Teflon (registered trademark) sheet of a thickness 50–100 µm is preferably arranged between the semiconductor element 111 and the press tool 116 in the case where the semiconductor element 111 of a thickness of 180 µm is to be embedded in the thermoplastic sheet base 115 formed of polyester terephthalate and having a thickness of 200 µm.

Although the press tool 116 is moved while the heating stage 117 is fixed in the instant example, the operation is not limited to this and a structure in which the heating stage 117 and the press tool 116 can move relatively in the thickness direction 171 is adoptable.

The semiconductor element 111 and the passive element 113 are pressed into the thermoplastic sheet base 115 by heating the press tool 116 and at the same time moving the press tool 116 by the drive unit 1161 towards the heating stage 117 with a load applied. At this time, while the thermoplastic sheet base 115, near the semiconductor element 111 and the rectangular passive element 113, becomes a viscous fluid and is being discharged to the periphery, the semiconductor element 111 and the rectangular passive element 113 are embedded in the thermoplastic sheet base 115 as indicated in FIG. 4.

A temperature control for the thermoplastic sheet base 115 is vital in the embedding operation. If the electronic components 111 and 113 and the thermoplastic sheet base 115 have temperatures that are too low, the viscosity of the thermoplastic sheet base 115 increases so as to cause an increase of a distance between the machining face of the thermoplastic sheet base 115 and each of electrodes 112 and 113a, whereby the thermoplastic sheet base 115 is blocked off from entering around the periphery of the electronic components 111 and 113. To the contrary, if the thermoplastic sheet base 115 is too high in temperature, the thermoplastic sheet base 115 is increased in its fluidity and easily catches bubbles, and possibly the electronic components 111 and 113 even penetrate the thermoplastic sheet base 115.

As such, in the case, for instance, where the 2–6 mm and 0.180 mm-thick semiconductor element 111 having 4–50 gold electrodes 112 of a diameter 80 µm and a height 40–60 µm is to be embedded in the thermoplastic sheet base 115 formed of terephthalate of a thickness 0.2 mm, preferably, the temperature of the thermoplastic sheet base 115 during the embedding operation is 150–170° C., the load by the press tool 116 is approximately 400–500N, and a pressing period of time is 20–150s.

After the above embedding operation, the drive unit 1161 moves up the press tool 116. The thermoplastic sheet base 115 having the semiconductor element 111 and the rectangular passive element 113 embedded is separated from the heating stage 117 and cooled to room temperature. The thermoplastic sheet base 115 hardens again due to the cooling. The projecting electrodes 112 and 113a are not yet exposed at the machining face 115a of the thermoplastic sheet base 115 at this time, or electrode surfaces are slightly covered with the gelled thermoplastic sheet base 115 even when the electrodes are exposed once. For instance, the distance in the thickness direction 171 from the electrode 112, 113a to the machining face 115a of the thermoplastic sheet base 115 is 100 µm at maximum in the example. Consequently an electric connection between element electrodes cannot be obtained in this state.

Figure 5:
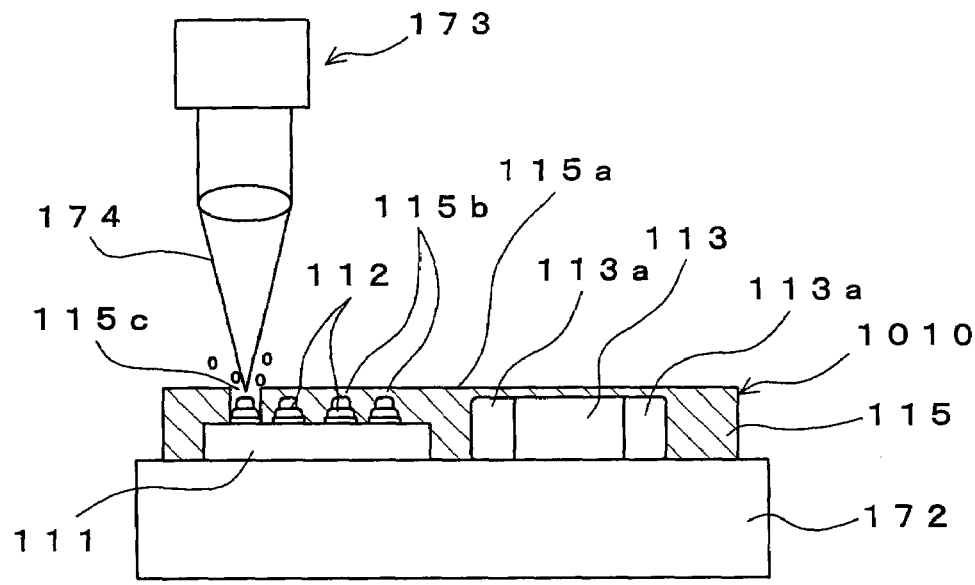
FIG. 5 is a diagram explanatory of the manufacturing process for the electronic component-mounted component of FIG. 1 and explanatory of a process of exposing electrodes.

In order to obtain the electric connection, in the present embodiment, the thermoplastic sheet base 115 which covers surfaces of the electrodes 112 and 113a is removed by at least one treatment of electric discharge machining, laser beam machining, ion beam machining, and electron beam machining. The laser beam machining is adopted here in the example. More specifically, a sheet module 1010 having the semiconductor element 111 and the rectangular passive element 113 embedded in the thermoplastic sheet base 115 as shown in FIG. 4 is inverted, and is placed on a stage 172 for laser beam machining so that the machining face 115a of the thermoplastic sheet base 115 covering the surfaces of the electrodes 112 and 113a and a laser generator 173 for generating laser beams are opposite to each other, as shown in FIG. 5. Then, for removing coating parts 115b of the thermoplastic sheet base 115 present on the electrodes 112 and 113a, a laser beam 174 is applied from the laser generator 173 for a fixed period of time while being focused on the machining face 115a corresponding to the coating parts 115b. The coating parts 115b are melted, further vaporized and removed by the exposure, whereby the electrodes 112 and 113a are exposed to the outside. The laser used is preferably a ruby laser, a glass laser, an Ar laser, a YAG laser, a $CO_2$ laser, an excimer laser or the like. Preferably, the laser power density is $10^{7-8}$ W/cm$^2$ and the application period of time is $10^{(-3)-(-5)}$s.

Since the electrodes 112 and the like are coated with the coating parts 115b before the laser beam machining as described above, the electrodes 112 and the like, a pattern position, etc. are first recognized by letting an infrared ray passes through in order to position an exposure position of the laser beam 174 to the electrodes 112 and the like. The recognition operation enables setting the exposure position with a high accuracy of, e.g., ±5 µm.

Figure 6:
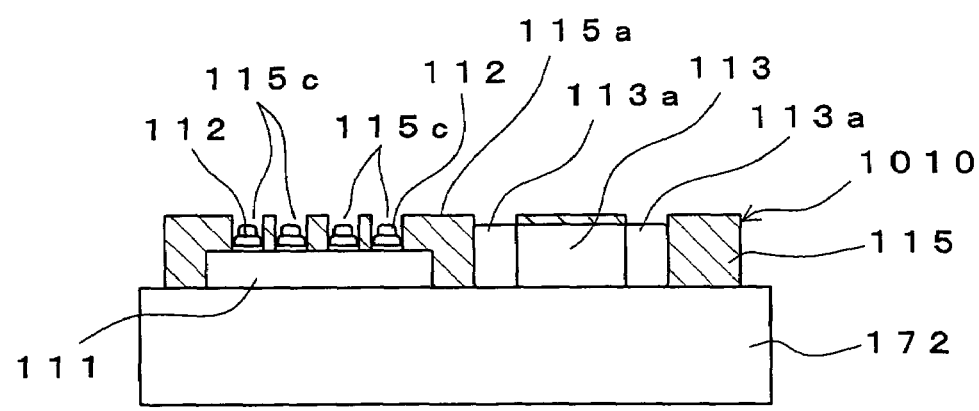
FIG. 6 is a diagram explanatory of the manufacturing process for the electronic component-mounted component of FIG. 1 and showing a state in which electrodes are exposed.

The sheet module 1010 in which the electrodes 112 and 113a are exposed at openings 115c formed by removing the coating parts 115b by the above laser beam machining is thus manufactured as shown in FIG. 6.

In the above laser beam machining, for instance, the openings 115c of a diameter of 80–100 µm and a depth of 40 µm are preferably formed in the periphery of the electrodes 112 for the module which has the 180 µm-thick semiconductor element 111 with the 40 µm-high and 80 µm-pedestal diameter projecting electrodes 112 of gold embedded in the thermoplastic sheet base 115 formed of, e.g., polyester terephthalate or the like in a film thickness of 250 µm.

After the openings 115c are formed as above, as shown in FIG. 1, the circuit pattern 119 is formed in contact with the exposed electrodes 112 and 113a. Known sputtering, vapor deposition, ion plating, plating, printing a conductive adhesive or the like method can be used as a forming method for the circuit pattern 119. The projection-shaped electrode 112 is shaped like a mountain and has a large surface area at the opening 115c, and is accordingly easy to catch the sputter, vapor deposition particles or conductive adhesive. Thus, a contact area for the circuit pattern forming material is made large, so that a connection resistance between the projection-shaped electrode 112 and the circuit pattern 119 is advantageously reduced.

In forming the circuit pattern 119, for example, by the aforementioned sputtering, a high voltage is impressed under a high vacuum to generate plasma with the use of, e.g., gold, silver, copper, aluminum, chromium, nickel, palladium or the like as a target material, thereby sputtering the target material and piling the target material particles via a mask onto the thermoplastic sheet base 115. A gas of Ar, $O_2$, HF or the like is preferably introduced at the sputtering operation.

Alternatively, the circuit pattern 119 may be formed with the use of the known photolithography after the entire face of the thermoplastic sheet base 115 is subjected to plating, vapor deposition or the like.

The circuit pattern 119 may also be formed by printing a conductive adhesive with mask, heating and then hardening the conductive adhesive. For instance, when a silver paste is used as the conductive adhesive, the printing is preferably carried out by a flat squeegee by 5 mm/s with the use of a mask of 250 mesh/inch, an emulsion thickness 0.030 mm and a mask thickness 0.100 mm. After the printing operation, the thermoplastic sheet base is put in a curing furnace to harden the conductive adhesive, whereby the circuit pattern 119 is formed. The conductive adhesive is preferably a silver paste, a copper paste, a silver palladium paste or the like.

As described hereinabove, according to the machining method of exposing the electrodes 112 and 113a with the utilization of laser beams, (1) machining is enabled in a considerably short period of time because the laser beam machining takes only lms or shorter per one machining spot as compared with the case in which the base is cut by dry etching or the like method, and (2) the base is less damaged because the machining is local heat input machining, as well as the other advantages exhibited.

Second Embodiment

Figure 7:
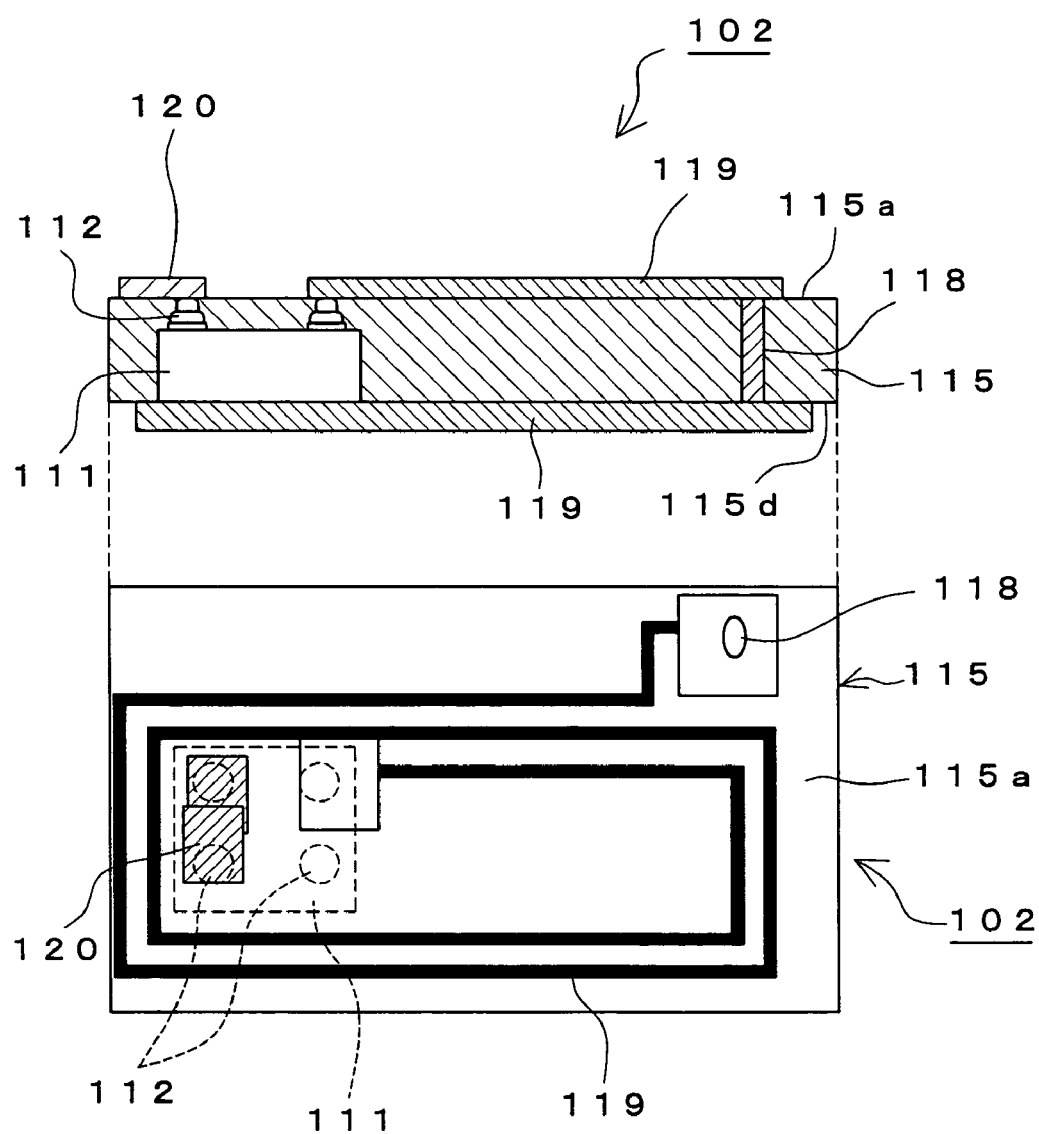
FIG. 7 is a sectional view of a modified example of the electronic component-mounted component shown in FIG. 1.

FIG. 7 shows a sheet module corresponding to the electronic component-mounted component 102 which has a through hole 118 penetrating the machining face 115a of the thermoplastic sheet base 115 and a rear face 115d opposite to the machining face 115a, and also a thin film capacitor 120 as contrasted with the electronic component-mounted component 101 shown in FIG. 1. The through hole 118 is formed by boring the thermoplastic sheet base 115 in its thickness direction by a laser, an ion beam or an electron beam. An inner peripheral face or inside of the through hole 118 is provided with a conductive material concurrently when the circuit pattern 119 is formed. Accordingly, an electric connection between the machining face 115a and the rear face 115d is obtained via the through hole 118 by at least one treatment of conductive sputtering, vapor deposition, filling a conductive material, and the like. A diameter of the through hole 118 is made, for instance, 0.1 mm. The thin film capacitor 120 is formed by sputtering or vapor depositing two kinds of conductive films to cover the electrodes 112 via a dielectric film. A spiral wiring pattern may be formed to form a coil as a part of the circuit pattern 119 as illustrated. The circuit pattern 119 may have a thin film resistance formed thereto.

Figure 8:
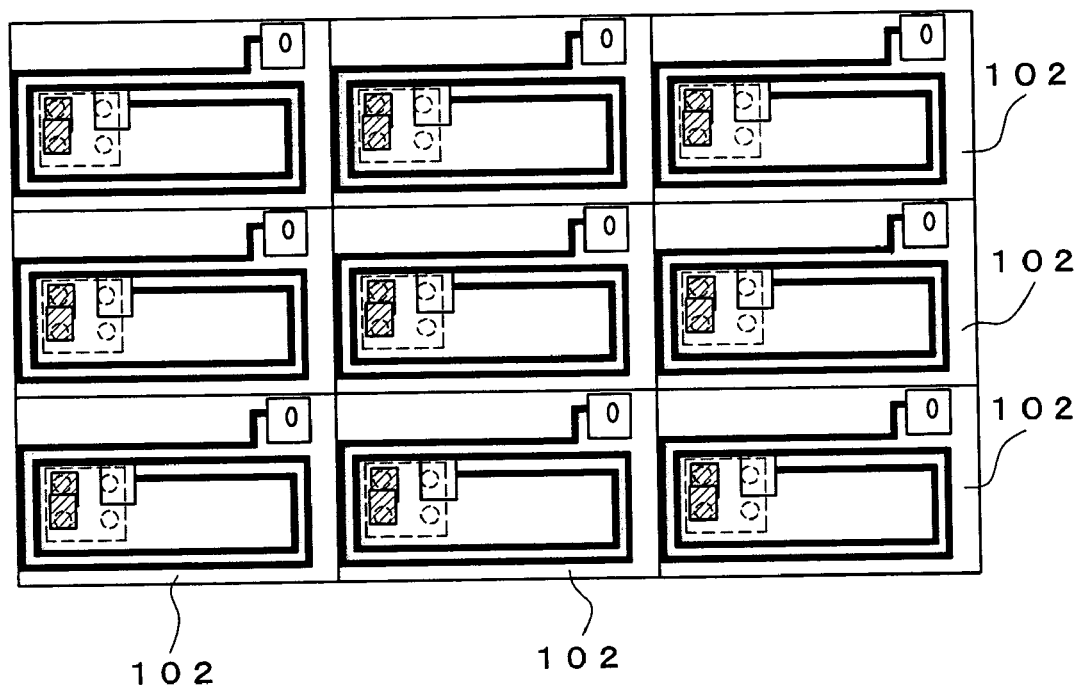
FIG. 8 is a diagram showing a state in which a plurality of the electronic component-mounted components of FIG. 7 are formed at one base.
Figure 9:
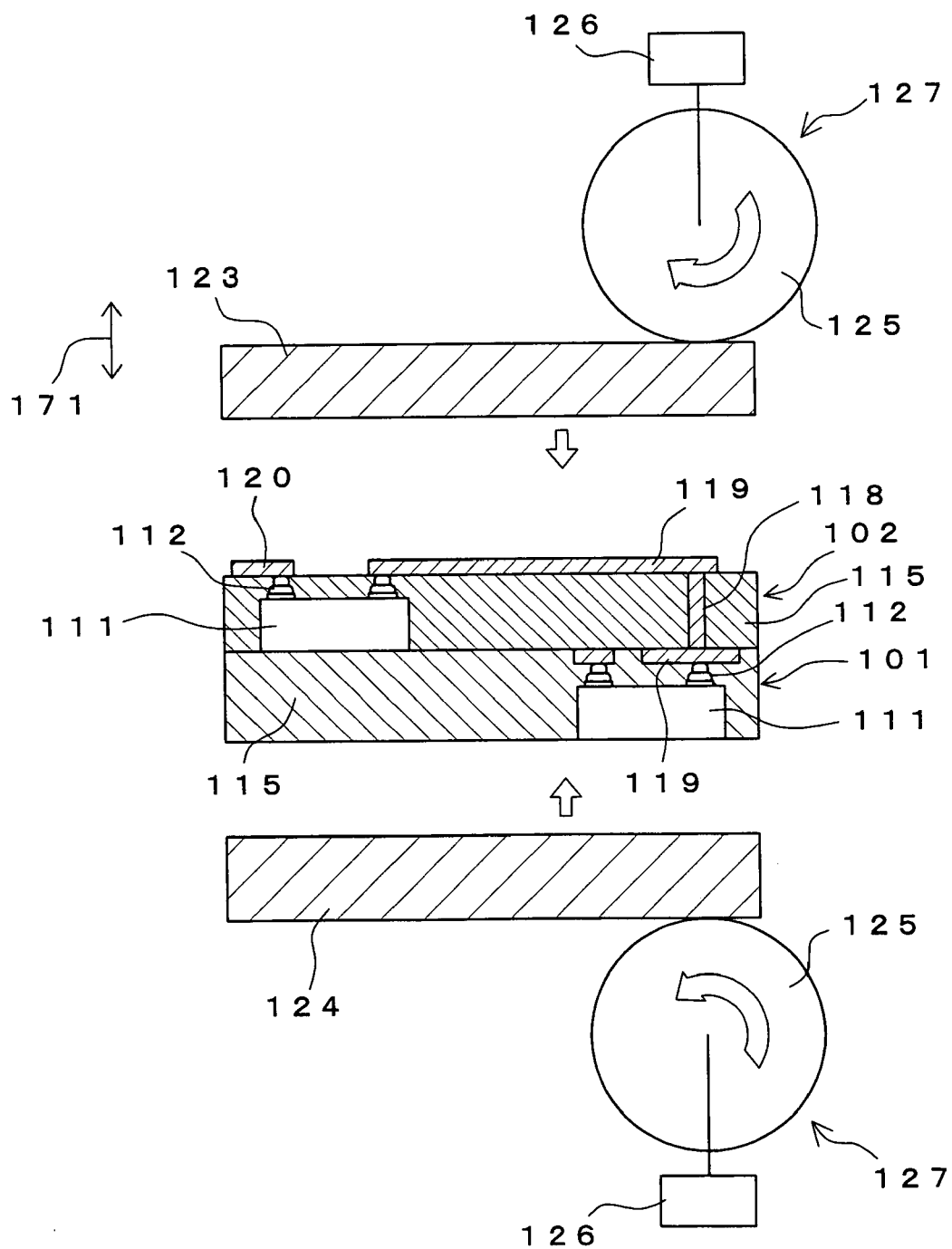
FIG. 9 is a diagram explanatory of a manufacturing method for the electronic component-mounted completed product shown in FIG. 2.

As shown in FIG. 8, a plurality of, for example, nine semiconductor elements 111 can be embedded in one thermoplastic sheet base 115, whereby nine of the electronic component-mounted components 102 can be manufactured at a single time. In this case, nine semiconductor elements 111 can be embedded altogether in the same process. The exposure process of electrodes 112 and the circuit pattern formation process for one thermoplastic sheet base 115 are carried out by the earlier depicted corresponding methods respectively. After nine electronic component-mounted components 102 are formed, the thermoplastic sheet base is cut in order to separate electronic component-mounted components 102 with the use of a dicing machine, a laser or the like.

Needless to say, the number of electronic component-mounted components 102 to be formed from one thermoplastic sheet base 115 is not restricted to the above nine.

Third Embodiment

The electronic component-mounted component 101 in the above first embodiment and the electronic component-mounted component 102 in the above second embodiment are stacked in the thickness direction thereof and moreover laminated by two sheet-shaped protecting materials 123 and 124 to cover the electronic component-mounted components 101 and 102, whereby the electronic component-mounted completed product 105 as shown in FIG. 2 can be manufactured. The electronic component-mounted-component 102 included in the electronic component-mounted completed product 105 of this third embodiment has no circuit pattern 119 formed at the rear face 115d. The electronic component-mounted component 101 and the electronic component-mounted component 102 are registered with each other so that the through hole 118 formed in the electronic component-mounted component 102 is electrically connected to the circuit pattern 119 of the electronic component-mounted component 101. The electronic component-mounted component 101 and the electronic component-mounted component 102 are held between the protecting materials 123 and 124 along the thickness direction 171 and then laminated by a rolling press 127 with two rollers 125 and a presser 126 for moving the rollers 125 in the thickness direction 171.

The electronic component-mounted completed product 105 formed in this manner is prevented from exposure of the electronic components 111 and 113 to the atmosphere and is accordingly made resistant to oxidation or migration. At the same time, the thermoplastic sheet base 115 and the like are also prevented from abrasion. The electronic component-mounted completed product can be formed into a thin card to be made portable. The number of electronic component-mounted components to stack is not limited to the above two and can be three or more.

A manufacturing apparatus for carrying out processes up to the exposure of electrodes 112 and 113a for the electronic component-mounted component in each of the foregoing embodiments will be depicted here.

Figure 10:
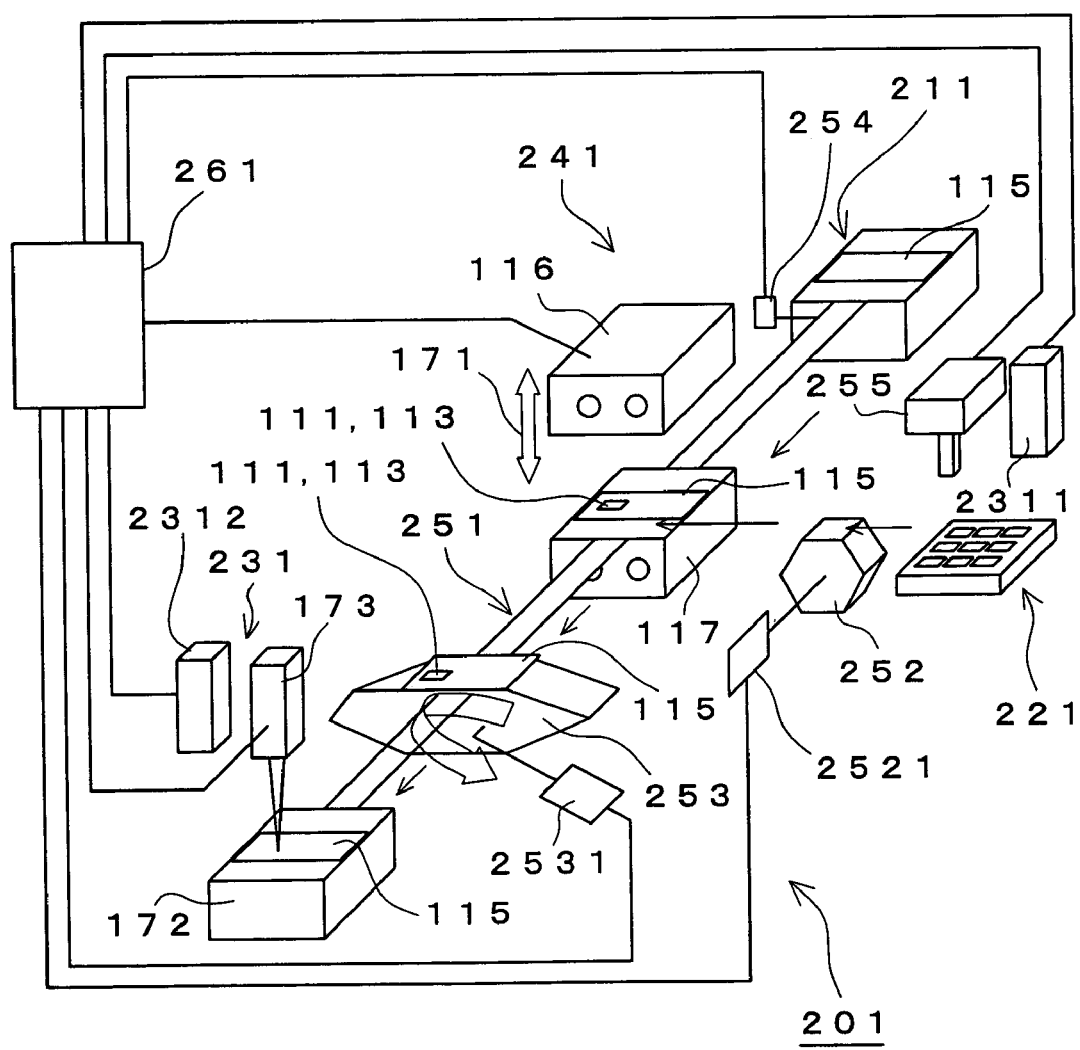
FIG. 10 is a diagram explanatory of the configuration of a manufacturing apparatus for manufacturing the electronic component-mounted component of FIG. 1.
Figure 11:
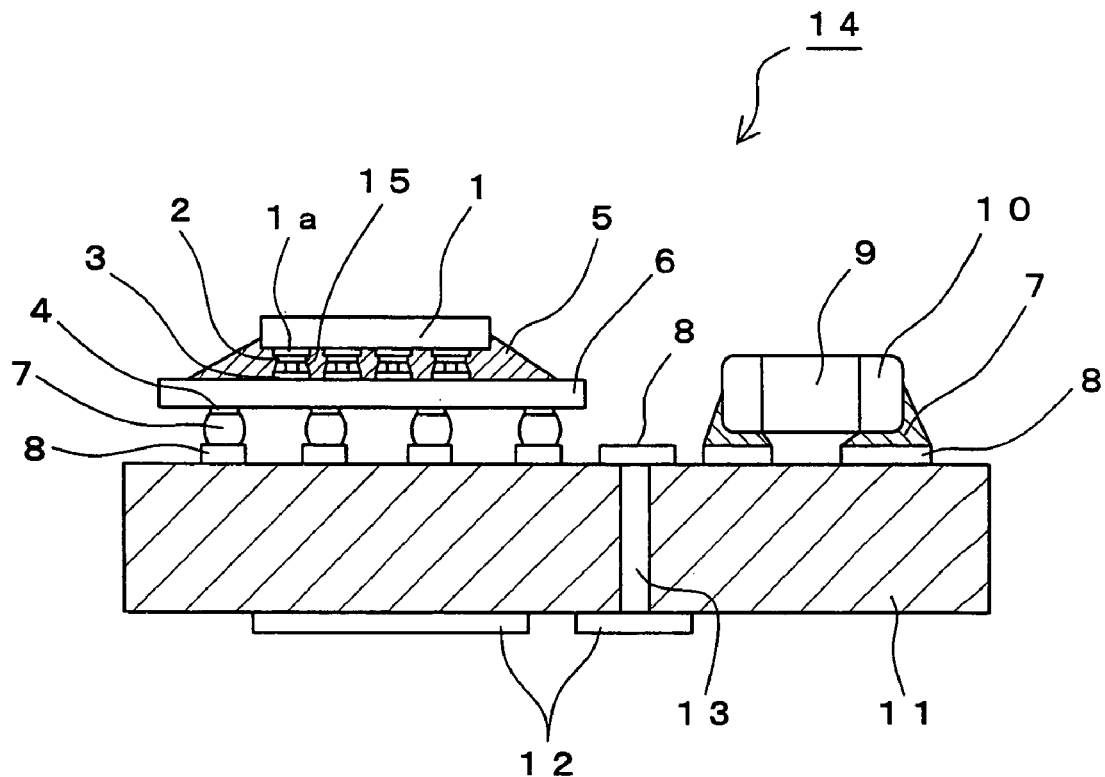
FIG. 11 is a sectional view of a conventional electronic component-mounted component.
Figure 12:
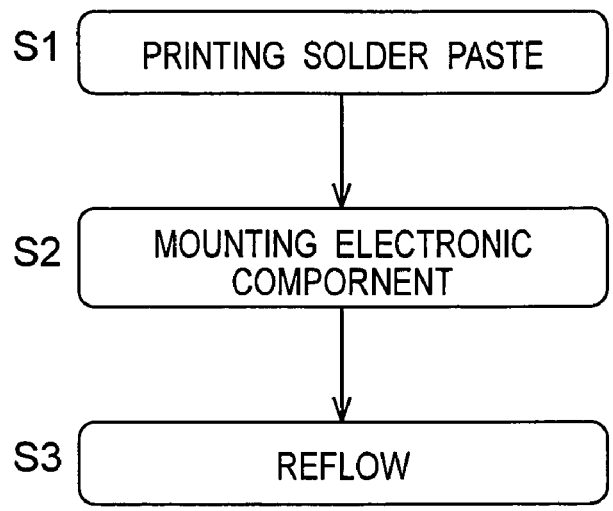
FIG. 12 is a flow chart showing a conventional manufacturing process for the electronic component-mounted component.

An electronic component-mounted component manufacturing apparatus 201 shown in FIG. 10 comprises a base supply device 211 for supplying the thermoplastic sheet base 115, an electronic component supply device 221 for supplying the semiconductor elements 111 and the passive elements 113, a recognizing device 231, a machining device 241, a transfer device 251, and a controller 261 for controlling the operation of each of these constituent parts.

The machining device 241 includes the heating stage 117, the press tool 116 and the like discussed with reference to FIGS. 3 and 4, and the laser generator 173 discussed with reference to FIG. 5.

The transfer device 251 has a transfer mechanism 254, a component holding mechanism 255, a semiconductor element inverting device 252, and a sheet material inverting device 253, which carries out a transfer operation by the transfer mechanism 254 for the thermoplastic sheet base 115 from the base supply device 211 to the heating stage 117 and from the heating stage 117 to the stage 172 for laser beam machining as well as an inverting operation for the semiconductor elements 111 by the semiconductor element inverting device 252 and an inverting operation for the thermoplastic sheet base 115 with embedded electronic components by the sheet material inverting device 253 installed in the middle of a transfer path from the heating stage 117 to the stage 172 for laser beam machining. The transfer of the thermoplastic sheet base 115 by the transfer mechanism 254 is executed by transferring a tray on which the thermoplastic sheet base 115 is placed. The semiconductor element inverting device 252 and the sheet material inverting device 253 have driving devices 2521 and 2531 respectively.

The component holding mechanism 255 transfers semiconductor elements 111 from the electronic component supply device 221 to the semiconductor element inverting device 252 and from the semiconductor element inverting device 252 to the heating stage 117.

The recognizing device 231 has a camera 2311 for semiconductor elements which recognizes the semiconductor element 111 arranged at the electronic component supply device 251 and held by the component holding mechanism 255 and which images the thermoplastic sheet base 115 placed on the heating stage 117, and a camera 2312 for laser beam machining which recognizes a machining position disposed above the stage 172 to be treated by the laser generator 173.

Operations in the electronic component-mounted component manufacturing apparatus 201 constituted as above will be described hereinafter.

In the first place, a plurality of sheets of the thermoplastic sheet base 115 to embed semiconductor elements 111 are prepared at the base supply device 211 and sequentially transferred onto the heating stage 117. The heating stage 117 and the press tool 116 may be used under any of the atmospheric pressure and vacuum pressure. Preferably, the heating stage 117 and the press tool 116 are equipped with a multi stage mechanism so that a plurality of sheets can be heat pressed while overlapping in the thickness direction 171, a rotary stage mechanism configured so that the thermoplastic sheet base 115 is sequentially transferred to each of a plurality of stages divided by functions such as preheating, practical heating and cooling and arranged in a circumferential form, or is accompanied with a temperature profile controller for carrying out a temperature control at a heat press operation and the like.

At the electronic component supply device 221, semiconductor elements 111 having projecting electrodes 112 preliminarily formed at electrode pads thereof are regularly stored in trays with electrode faces turned upside. The trays are piled in a multi stage. However, a storing method for the semiconductor elements 111 is not limited to this and, the semiconductor elements of wafers may be stored as they are.

Secondly, characteristic points of the semiconductor elements 111 at formation faces of projecting electrodes 112, circuit patterns, outlines of the semiconductor elements 111 or the like are recognized by the camera 2311 for semiconductor elements, thereby selecting a desired semiconductor element 111 to be embedded. Then, the selected semiconductor element 111 is sucked and held by the component holding mechanism 255 having a suction function, and placed on the semiconductor element inverting device 252. After the rear face of the semiconductor element 111 is made upside by rotating the semiconductor element inverting device 252, the semiconductor element 111 is sucked and held again at the rear face by the component holding mechanism 255.

In the meantime, an embedding position at the thermoplastic sheet base 115 on the heating stage 117 is recognized by the camera 2311 for semiconductor elements, and then the inverted semiconductor element 111 is placed on the thermoplastic sheet base 115 on the heating stage 117.

Thereafter, the press tool 116 is moved to heat press the thermoplastic sheet base while a load is applied to the sheet base. The driving unit 1161 of the press tool 116 shown in FIG. 3 is preferably controlled by the controller 261. The controller 261 controls a start position where the press tool 116 starts coming into contact with the semiconductor element 111, a pressing end position, a descend velocity, an ascend velocity and the like.

After the semiconductor element 111 is embedded in the thermoplastic sheet base 115, and the sheet module after the embedding is cooled, the sheet module 1010 is transferred onto the sheet material inverting device 253 and inverted by the sheet material inverting device 253. The sheet module 1010 is subsequently placed on the stage 172 for laser beam machining of a laser beam machining unit.

After the laser beam machining position is recognized by the camera 2312 for laser beam machining, the laser beam 174 is applied by the laser generator 173 to illuminate the machining face 115a of the thermoplastic sheet base 115 until the electrodes 112 and 113a are exposed. A machining period of time, a laser output and the like of the laser generator 173 are preferably made settable.

The sheet module 1010 with the electrodes 112 and 113a exposed is formed by the above operation. The sheet module is transferred by a transfer device not illustrated from the stage 172 for laser beam machining to a forming process for the circuit pattern 119 in a next stage or the like.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A manufacturing method for electronic component-mounted components, which comprises:
   embedding an electronic component into a base made of a resin sheet;
   removing at least a portion of the base by carrying out at least one treatment of electrical discharge machining, laser beam machining, ion beam machining and electron beam machining to a machining face of the base, and thereby exposing electrodes of the embedded electronic component; and
   forming a circuit pattern in contact with the exposed electrodes.

2. A manufacturing method for electronic component-mounted components, which comprises:
   embedding an electronic component into a base;
   removing at least a portion of the base by carrying out at least one treatment of electrical discharge machining, laser beam machining, ion beam machining and electron beam machining to a machining face of the base, and thereby exposing electrodes of the embedded electronic component;
   forming a circuit pattern in contact with the exposed electrodes; and
   forming a through hole to penetrate the machining face and a rear face opposite to the machining face while carrying out the treatment to the base, and while forming the circuit pattern, forming an electric connection between the machining face and the rear face via the through hole by at least one of conductive sputtering, vapor deposition and filling a conductive material.

3. The manufacturing method for the electronic component-mounted components according to claim 1, wherein the electrodes of the electronic component have projecting electrodes, and the exposing operation after the embedding into the base is to expose the projecting electrodes.

4. The manufacturing method for the electronic component-mounted components according to claim 1, wherein the circuit pattern forming operation forms at least one of a conductor routing, a metal thin film capacitor, a coil and a resistance in contact with the exposed electrodes by any one of plating, ion plating, sputtering and vapor deposition.

5. The manufacturing method for the electronic components-mounted components according to claim 1, wherein the circuit pattern forming operation forms the circuit pattern by printing a solder paste or conductive adhesive on the exposed electrodes, then heating and hardening the solder paste or conductive adhesive.

6. The manufacturing method for the electronic component-mounted components according to claim 1, wherein embedding the electronic component into the base is carried out to a plurality of electronic components in the same process, and after the circuit pattern is formed, the base is cut so as to correspond to respective electronic component-mounted components.

7. The manufacturing method for the electronic component-mounted components according to claim 1, wherein embedding the electronic components into the base is carried out by heat press, the base is a formed of any one of polyvinyl chloride, polycarbonate, acrylonitrile butadiene styrene, thermoplastic polyimide and polyethylene terephthalate and has a thickness of 0.010–2.000 mm, a glass transition point of the base is not lower than 333K and not higher than 423K, the electronic component has a thickness smaller than that of the base, electrodes of the electronic component have a height of 0.0005–0.1 mm, and the base at the heat press time is set to be a temperature higher by 50K or more than the glass transition point and not higher than 473K.

8. A manufacturing method for electronic component-mounted completed products, which comprises:
manufacturing electronic component-mounted components by a manufacturing method for electronic component-mounted components;
stacking the electronic component-mounted components or a base of the electronic component-mounted components in a thickness direction of the base after the manufacturing operation; and
executing a laminating process after the stacking operation,
the manufacturing method for electronic component-mounted components including:
embedding an electronic component into the base, which is formed of a resin sheet,
removing at least a portion of the base by carrying out at least one treatment of electrical discharge machining, laser beam machining, ion beam machining and electron beam machining to a machining face of the base, and thereby exposing electrodes of the embedded electronic component, and
forming a circuit pattern in contact with the exposed electrodes.

9. An electronic component-mounted completed product manufactured by a manufacturing method for electronic component-mounted completed products, the manufacturing method comprising:
manufacturing electronic component-mounted components by a manufacturing method for electronic component-mounted components;
stacking the electronic component-mounted components or a base of the electronic component-mounted components in a thickness direction of the base after the manufacturing operation; and
executing a laminating process after the stacking operation,
the manufacturing method for electronic component-mounted components including:
embedding an electronic component into the base, which is formed of a resin sheet,
removing at least a portion of the base by carrying out at least one treatment of electrical discharge machining, laser beam machining, ion beam machining and electron beam machining to a machining face of the base, and thereby exposing electrodes of the embedded electronic component, and
forming a circuit pattern in contact with the exposed electrodes.

10. The manufacturing method for electronic component-mounted components according to claim 1, wherein the embedding operation comprises pressing the electronic component into the resin sheet with a pressing tool while the resin sheet is supported on a heating stage.

11. A manufacturing method for electronic component-mounted completed products according to claim 8, wherein the embedding operation comprises pressing the electronic component into the resin sheet with a pressing tool while the resin sheet is supported on a heating stage.

12. The electronic component-mounted completed product manufactured by a manufacturing method for electronic component-mounted completed products according to claim 9, wherein the embedding operation comprises pressing the electronic component into the resin sheet with a pressing tool while the resin sheet is supported on a heating stage.

* * * * *

UNITED STATES PATENT AND TRADEMARK OFFICE
CERTIFICATE OF CORRECTION

| | |
|---|---|
| PATENT NO. | : 7,084,008 B2 |
| APPLICATION NO. | : 10/694347 |
| DATED | : August 1, 2006 |
| INVENTOR(S) | : Daisuke Sakurai et al. |

It is certified that error appears in the above-identified patent and that said Letters Patent is hereby corrected as shown below:

In column 13, line 33, "base is a formed" should read --base is formed--.

Signed and Sealed this

Sixth Day of February, 2007

JON W. DUDAS
*Director of the United States Patent and Trademark Office*